United States Patent [19]
Snyder et al.

[11] Patent Number: 5,081,639
[45] Date of Patent: Jan. 14, 1992

[54] LASER DIODE ASSEMBLY INCLUDING A CYLINDRICAL LENS

[75] Inventors: James J. Snyder, San Jose. Patrick Reichert, Hayward, both of Calif.

[73] Assignee: The United States of America as represented by the United States Department of Energy, Washington, D.C.

[21] Appl. No.: 591,409

[22] Filed: Oct. 1, 1990

[51] Int. Cl.$^5$ ............ H01S 3/08; B29D 11/00; G02B 13/18

[52] U.S. Cl. .................. 372/101; 359/708; 359/710; 359/720

[58] Field of Search ............ 372/98, 101, 70, 75; 350/432, 433, 435, 436, 96.18; 250/578.1

[56] References Cited

U.S. PATENT DOCUMENTS

| | | | |
|---|---|---|---|
| 3,284,722 | 11/1966 | Gray | 372/75 |
| 3,736,518 | 5/1973 | Anderson et al. | 372/42 |
| 4,009,394 | 2/1977 | Mierzwinski | 350/433 X |
| 4,185,891 | 1/1980 | Kaestner | 350/167 |
| 4,268,112 | 5/1981 | Peterson | 350/96.18 |
| 4,439,861 | 3/1984 | Bradford | 372/25 |
| 4,785,459 | 11/1988 | Baer | 372/75 |
| 4,837,771 | 6/1989 | Baer | 372/75 |
| 4,890,289 | 12/1989 | Basu et al. | 372/33 |
| 4,908,832 | 3/1990 | Baer | 372/75 |
| 4,945,544 | 7/1990 | Tanaka et al. | 372/70 |
| 4,962,983 | 10/1990 | Watanabe | 350/6.8 |

OTHER PUBLICATIONS

N. F. Borrelli et al., "Photolytic technique for producing microlenses in photosensitive glass", Appl. Opt., vol. 24, No. 16, pp. 2520-2525, Aug. 15, 1985.
M. Oikawa et al., "A Distributed-Index Planar Micro-Lens Made of Plastics", Jpn J. Appl. Phys., vol. 20, No. 1, pp. L51-L54, Jan. 1981.
L. B. Lesem et al., "The Kinoform: A New Wavefront Reconstruction Device", IBM J. Res. Dev., vol. 13, pp. 150-155, Mar. 1969.
J. A. Jordon, Jr. et al., "Kinoform Lenses", Appl. Opt., vol. 9, No. 8, pp. 1883-1887, Aug. 1970.
T. M. Baer et al., "High Efficiency diode-bar pumped solid state laser using a tightly folded resonator", in Conference on Lasers and Electro-Optics (1989), paper FJ5.

*Primary Examiner*—William L. Sikes
*Assistant Examiner*—Galen J. Hansen
*Attorney, Agent, or Firm*—Henry P. Sartorio; L. E. Carnahan; William R. Moser

[57] ABSTRACT

The present invention provides a diffraction limited, high numerical aperture (fast) cylindrical microlens. The method for making the microlens is adaptable to produce a cylindrical lens that has almost any shape on its optical surfaces. The cylindrical lens may have a shape, such as elliptical or hyperbolic, designed to transform some particular given input light distribution into some desired output light distribution. In the method, the desired shape is first formed in a glass preform. Then, the preform is heated to the minimum drawing temperature and a fiber is drawn from it. The cross-sectional shape of the fiber bears a direct relation to the shape of the preform from which it was drawn. During the drawing process, the surfaces become optically smooth due to fire polishing.

17 Claims, 5 Drawing Sheets

LASER DIODE ASSEMBLY INCLUDING A CYLINDRICAL LENS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to microlenses. More specifically, the present invention relates to cylindrical microlenses for use with laser diodes and integrated optics.

This application is related to another application, entitled "Method for Fabrication of Cylindrical Microlenses of Selected Shape", by James J. Snyder and Thomas M. Baer, Ser. No. 07/591,462, filed of even date herewith.

2. Description of Related Art

A lens is an optical element that can focus or de-focus light. The most familiar types of lenses are circular; for example, a circular converging lens focuses light to a point. Such lenses are useful for many applications, such as imaging and photography. The familiar circular lens has a shape that is symmetrical around the optical axis.

Another important type of lens is a cylindrical lens. A cylindrical converging lens focuses light along a line, typically termed the "line focus". The typical cylindrical lens is shaped symmetrically around a principal axis, which is orthogonal to the optical axis. For example, a cylindrical glass lens may have the shape of a cylinder, with circular dimensions around a central axis. Light is made incident on a first curved surface of the cylinder, and exits from the other, second curved side of the cylinder.

However, for many applications, a circular cross-section is undesirable, and therefore, the curves of cylindrical lenses may require specific shapes quite different from the circular curve of the previous example. The required shape might be flat or it could be some other non-circular curve such as elliptical or hyperbolic. In other words, cylindrical lenses may be formed with a variety of curved surfaces. The exact shape chosen is highly dependent upon the application.

The circular and flat shapes are easy to manufacture, and are common in cylindrical lenses. However, these shapes have disadvantages, such as spherical aberration which causes mis-focusing of marginal rays. Spherical aberration can be substantially reduced by careful design and manufacture of the shape of the input and output surfaces. Other types of aberrations, such as coma can also be reduced by careful lens design and manufacture. If a lens is designed to substantially reduce all significant aberrations, then it may be termed "diffraction-limited". A diffraction-limited lens makes efficient use of the light it receives by providing the highest intensity at the focus.

A figure of importance for any lens is its numerical aperture. Quantitatively, the numerical aperture is given by:

N.A. (numerical aperture) = n sin $\theta$, where $\theta$ is the angular semi-aperture of the lens and n is the refractive index of the medium in which the light is focused. The numerical aperture is a measure of the resolving and light gathering power of a lens. The numerical aperture is affected by the size of the aperture and its focal length. If the numerical aperture of a lens is greater than the numerical aperture of the source that the lens is collimating, then all light from the source can be collimated. On the other hand, if the numerical aperture of the lens is less than that of the source, then some of the light emitted from the source cannot be collimated, and may be lost or directed away. If a lens has a high numerical aperture, then it may be termed "fast".

Carefully designed lens surfaces can be manufactured on large scale optics (>5 mm) with large numerical apertures (0.5 or better) by conventional grinding and polishing techniques. However, for smaller scale lenses (<5 mm), conventional grinding and polishing techniques are unable to produce optical quality cylindrical lenses. For small microlenses (<1 mm) other techniques have been developed. Microlenses have been manufactured using photosensitive glass, graded index glass, and as computer-generated diffractive optics or kinoforms. None of these techniques has been able to produce a lens with a numerical aperture approaching 0.5 and greater.

In fabricating microlenses from photosensitive glass, a mask is first deposited on the glass, and the material outside the desired lens is exposed to light. When the glass is subsequently heated, the exposed material expands its volume, and the unexposed lens region is compressed. The compression causes the lens region to bulge, forming a simple lens.

Graded index microlenses are formed by diffusing index-changing material into glass. The diffusion process yields an index of refraction that varies smoothly from the lens center to the edge. The graded index focuses the light much as a conventional lens does.

In a binary diffractive optic or computer-generated kinoform, the surface of a glass plate is etched according to a pattern generated by computer. The etched surface is designed to diffract light to a focal point, so that it performs like a conventional lens.

Cylindrical microlenses fabricated from photosensitive glass and graded index planar microlenses can be produced inexpensively in quantity, but these single optical elements are limited in speed to numerical apertures of 0.25 to 0.32, and furthermore they cannot be corrected for spherical aberration. Diffractive optic kinoforms can be corrected for aberrations, but efficient kinoform lenses with numerical apertures approaching 0.5 require the use of sub-quarter-micron lithography, which is currently beyond the state of the art.

Optical fibers with a circular cross-section have been used for cylindrical lenses. Optical fiber is inexpensive and readily available. However, circular optical fibers are not corrected for spherical aberration; i.e., such optical fibers are not diffraction limited.

It would be an advantage to provide a custom-designed, diffraction limited, fast cylindrical lens, and an inexpensive method for making a such a lens. The lens could be designed with any of a variety of input and output surfaces. Such a lens could be designed to correct for spherical aberration, for example.

Cylindrical microlenses could be utilized for integrated optics, and for focusing of laser diode bars. In integrated optics, a carefully designed cylindrical microlens could efficiently and conveniently couple light into or out of narrow waveguides, or any narrow slit.

In another application, cylindrical microlenses could form a part of a low cost, high efficiency laser diode system for pumping higher power lasers. Presently, high power lasers have a gain material that is optically pumped by high intensity flashlamps that are inefficient and have high voltage requirements. Compared with flashlamps, laser diodes are more efficient and long-lived, and require low voltage electrical sources rather than the high voltage sources used to pump flashlamps. Replacement of flashlamps with laser diodes would increase efficiency of a high power laser by reducing electrical costs, and such replacement would also increase reliability and longevity. Furthermore, a laser diode emits substantially a single wavelength, which can be chosen to match the absorption spectra of the gain material for high efficiency conversion from pump energy to stored energy in the gain material. The pumping energy can be supplied from an array of laser diodes, which may comprise a number of laser diode bars closely stacked. In such an arrangement, it is useful if substantially all the light emitted by the laser diode bars is delivered to the solid state gain material. For this purpose, it is advantageous that the diode laser beams from each individual laser diode bar be directed to the gain material. Any portion of the beam not directed to the gain material may be lost energy. However, the laser diode bars have a numerical aperture of about 0.5, and therefore a suitable cylindrical lens should have a 0.5 numerical aperture or higher, a figure that is beyond the state of the current technology.

If one were available, a diffraction limited cylindrical lens having a numerical aperture greater than 0.5 could collimate a beam from a laser diode. A collimated beam is one that is neither converging nor diverging; i.e., the rays within the beam are travelling substantially parallel. By comparison, a focused beam converges to the point of focus, and then diverges to infinity. The laser diode bar is an efficient source of laser radiation, however the highly divergent beam emitted from the laser diode presents problems in applications. The divergence of the laser diode's beam is caused by its exit aperture, which is very narrow along one axis (the "fast" axis), and much wider along the other (perpendicular) axis. The cross-section of the beam emitted along the fast axis (the narrow aperture) is highly divergent due to diffraction effects. In comparison, the wider aperture emits a beam cross-section that diverges only slightly. Conventional optical fibers with a circular cross-section have been used to collimate the beam from a laser diode bar. However, the circular fiber is not diffraction limited; the circular shape has the disadvantage of spherical aberration and thus a large portion of the light focused by such a fiber would be misdirected.

SUMMARY OF THE INVENTION

The present invention provides a method for making a diffraction limited, high numerical aperture (fast) noncircular cylindrical microlens. The method is adaptable to produce a cylindrical lens that has almost any shape on either or both of its optical surfaces, with a numerical aperture as high as 1.5. The cylindrical lens may be diffraction limited over its numerical aperture. In some embodiments, the cylindrical lens may have a curved optical surface that has the shape of a hyperbola, or in other embodiments it may have the shape of an ellipse. In still other embodiments, the cylindrical lens may have some other shape designed to transform some particular given input light distribution into some desired output light distribution.

The desired shape is first formed in a glass preform that is large relative to the final product. With dimensions of this magnitude, conventional grinding techniques can be used to form the desired shape. Then, the glass preform is heated to the minimum drawing temperature and a microlens of the desired dimensions is drawn from it. The cross-sectional shape of the glass remains constant as it is drawn. As a result, the cross-sectional dimensions get smaller and smaller, while the shape remains the same. As an advantage, imperfections in manufacturing the preform ("figure errors") are reduced to insignificance (less than one wavelength) as the preform is drawn into the microlens. For example, a 0.001 inch defect in the preform will be reduced to insignificance in the final cylindrical microlens. As an additional advantage, during the drawing process, the surfaces of the cylindrical lens become optically smooth due to fire polishing.

The present invention has many applications, such as integrated optics, optical detectors and laser diodes. The lens, when connected to a laser diode bar, can provide a high intensity source of laser radiation for pumping a high average power solid state laser. In integrated optics, a lens can be used to couple light into and out of apertures such as waveguides. The lens can also be used to collect light, and focus it on a detector.

DETAILED DESCRIPTION OF THE INVENTION

The invention is best understood by reference to the figures wherein like parts are designated with like numerals throughout.

Figure 1:
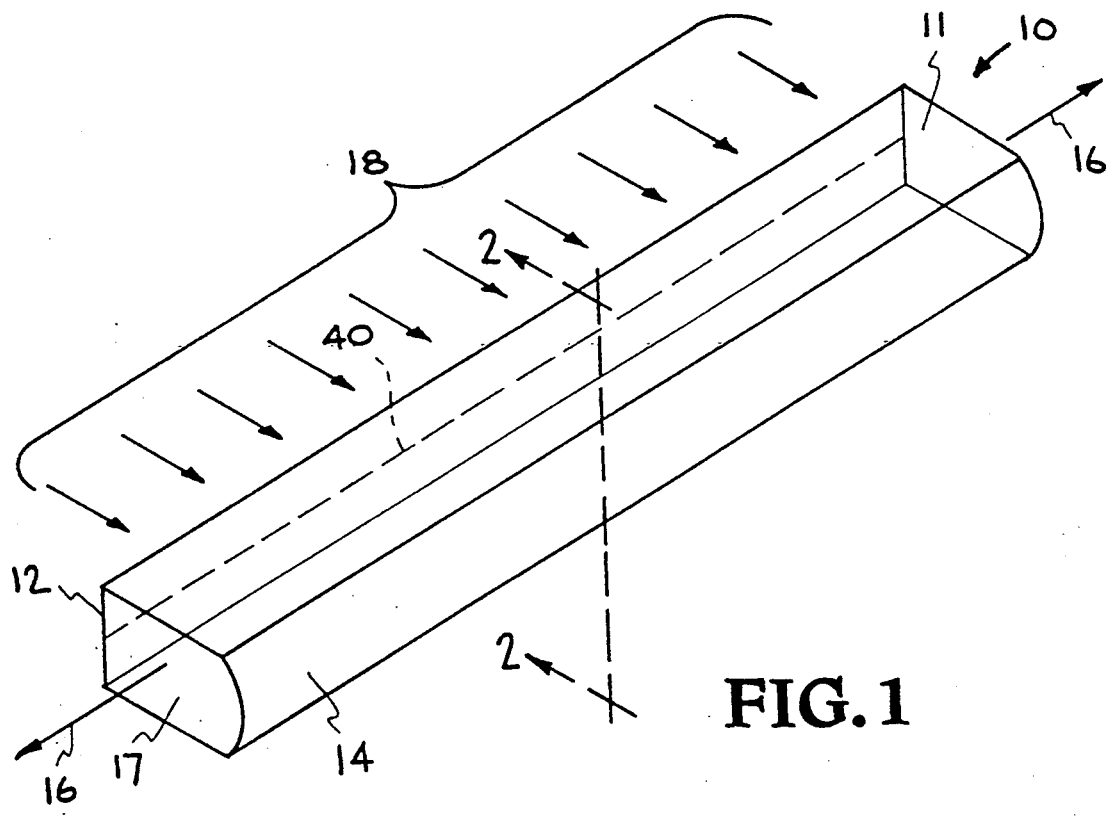
FIG. 1 illustrates a cylindrical lens.
Figure 2:
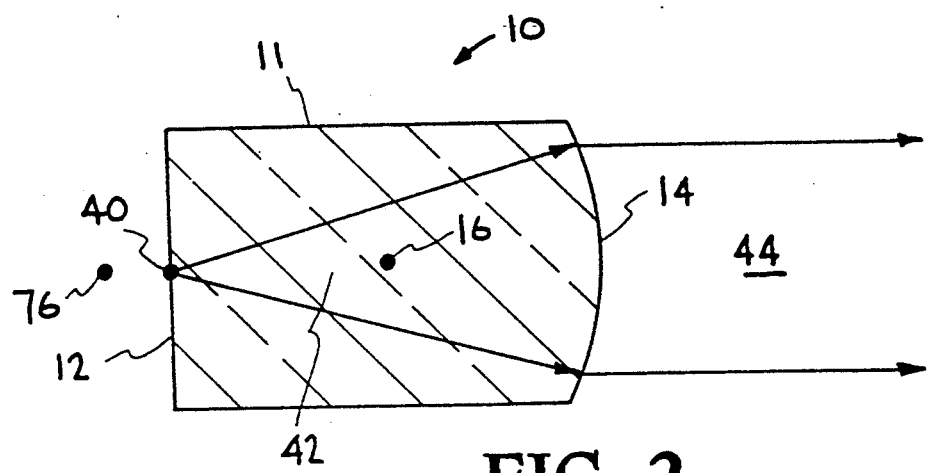
FIG. 2 illustrates a cross-section along the section shown in FIG. 1, of a cylindrical lens having an elliptical surface.

FIGS. 1 and 2 illustrate a cylindrical lens 10, comprising a body 11, having a first surface 12 and a second surface 14. The cylindrical lens 10 has a cross-section that is constant along a cylindrical axis 16; the cross-section shown in FIG. 2 illustrates the same configuration as the outward facing end 17 illustrated in FIG. 1. As illustrated in FIG. 1, light rays 18 enter the body 11 of the cylindrical lens 10 through the first surface 12, and exit the lens 10 through the second surface 14. In other configurations, the direction of light propagation may be reversed.

The light passing through the cylindrical lens 10 is greatly affected by the shape of the first surface 12 and the second surface 14. Depending upon the shapes of the surfaces 12, 14, and also depending upon the propagation direction of the light, the exiting light may be focused, de-focused, distorted, or otherwise changed in characteristics. As illustrated, the shape of the first surface 12 is flat, and the second surface 14 is convex; therefore, such that the cylindrical lens 10 illustrated in FIGS. 1 and 2 is a collimating lens; light focused at input surface 12 will emerge from output surface 14 as parallel rays. In other embodiments, for different properties, the shapes of the surfaces 12,14 may comprise any of a variety of configurations, such as concave, planar, and they may have different radiuses of curvature.

According to the present invention, a method is provided for fabricating cylindrical microlenses, the method comprising the steps: (a) forming a glass preform 20 (FIGS. 3 and 4) having a noncircular shape of a cylindrical lens, and (b) drawing the glass preform 20 to reduce its cross-sectional dimensions while retaining its cross-sectional shape, to provide a cylindrical microlens with a high numerical aperture or other desirable characteristics.

Figure 3:
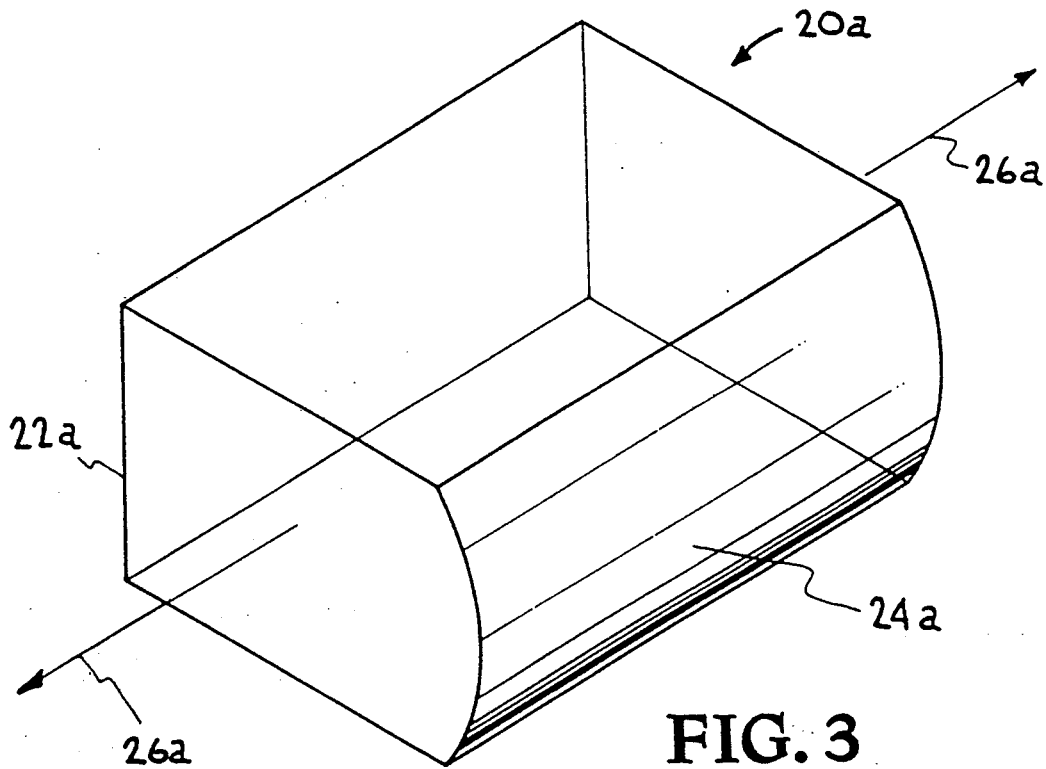
FIG. 3 is an example of a glass preform having the shape of a cylindrical lens.
Figure 4:
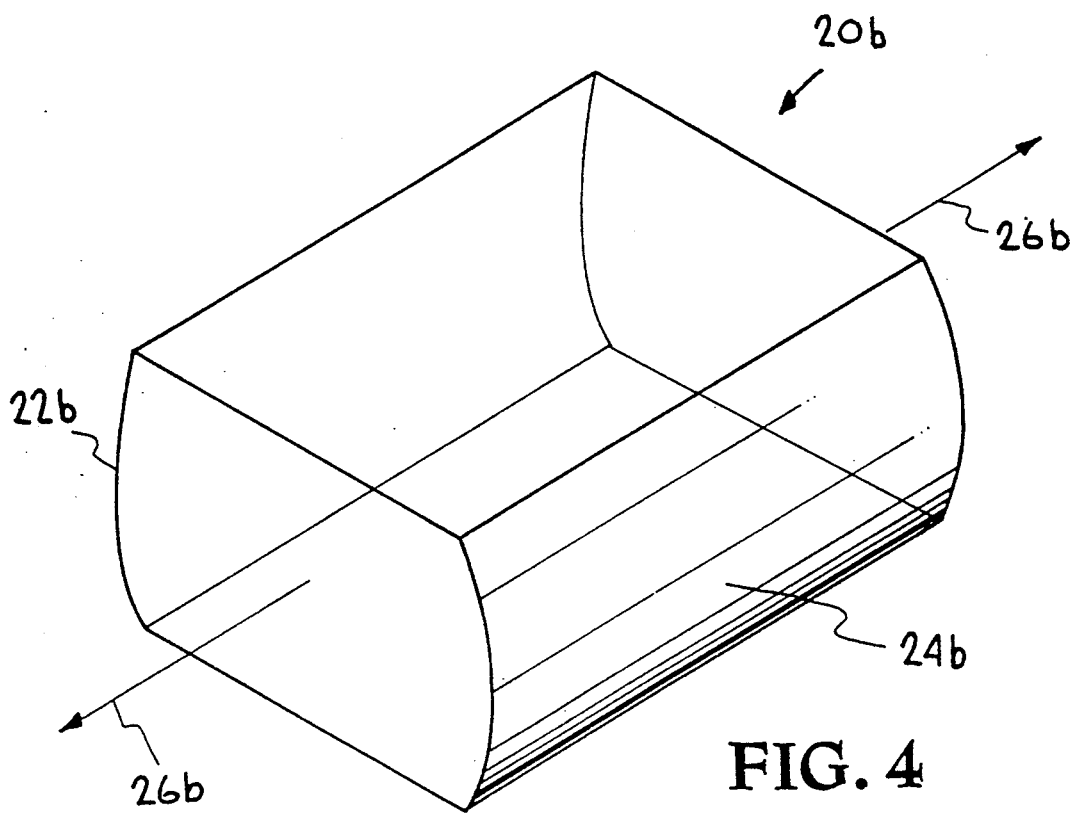
FIG. 4 is another example of a glass preform having the shape of a cylindrical lens.

Examples of the glass preform 20 are illustrated generally at 20a,20b in FIGS. 3 and 4. Each glass preform 20 has a cylindrical cross section that comprises a first surface 22, and a second surface 24. The cross-section is constant along a cylindrical axis 26. FIG. 3 shows a configuration wherein the glass preform 20a comprises a first surface 22a having a flat shape, and a second surface 24a having a curved shape. FIG. 4 illustrates another configuration of the glass preform 20b, wherein a first surface 22b and a second surface 24b both comprise a curved shape.

The specific cross-sectional shape of the preform 20 is of course highly dependent upon the desired application of the cylindrical lens that will be formed from it. The shape of the preform 20 is substantially retained throughout the drawing process, and therefore the cross-sectional shape of the preform 20 is chosen to transform some particular given input light distribution into some desired output light distribution in the final cylindrical microlens. In some embodiments, either or both surfaces 22,24 of the preform 20 may have the shape of a hyperbola, or in other embodiments either or both surfaces 22,24 may have the shape of an ellipse. In one embodiment of FIG. 4, each surface 22b,24b may comprise the shape of a hyperbola in opposing relations as illustrated in that Figure.

To form the glass preform 20, any of a number of conventional means, such as grinding, molding, or extruding, may be used. The quality of the finished cylindrical microlens is dependent upon the quality of the surfaces of the glass preform 20; preferably, the formation technique is chosen to produce a smooth and accurate surface on the glass preform. However, the method of the present invention allows some leeway for "figure errors", which are slight errors in manufacturing the glass preform 20. For example, a 0.001 inch defect in the preform 20 will be reduced to insignificance in the final cylindrical microlens.

Figure 5:
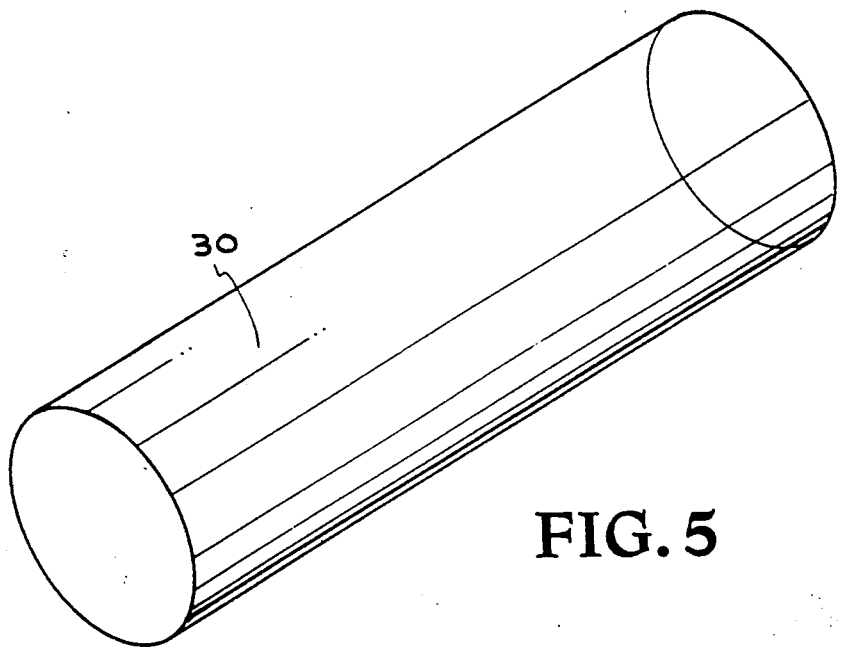
FIG. 5 is an example of a glass rod used to make a glass preform.

In the preferred embodiment, a numerically controlled universal grinder, such as the model 1632 CNC Cylindrical Grinder with an optional CNC programmable workhead for nonround grinding, available from Weldon Machine Tool of York, Pa., is used to form the preform 20. The glass preform 20 may be ground from a circular glass rod such as the rod 30 shown in FIG. 5. Using the universal grinder, the rod 30 is formed into an arbitrary shape; thus, the glass preform 20 can comprise an infinite variety of shapes.

In the molding process for forming the preform 20, a mold of the desired shape is tooled using conventional means. Then, conventionally, the molten glass is poured or pressed into the mold to fabricate the preform 20. The molding process has the advantage of consistency and precision from preform to preform. The initial tooling cost for making the mold is expensive, but once the mold is formed, additional preforms 20 are easy to make.

After the glass preform 20 has been formed, it is drawn in a manner that is analogous to methods used in the optical fiber industry. The glass preform 20 is heated at least to the minimum drawing temperature, and a microlens fiber of the desired dimensions is drawn from it. The cross-sectional shape of the glass preform 30 remains constant as it is pulled, however, the cross-sectional dimensions get smaller and smaller. During the process, the surfaces become optically smooth from fire-polishing, which, it is believed, results because the temperature on the surface is greater than the inside temperature. Fire-polishing is a skin effect.

In the drawing process, the glass preform 20 is heated to at least a softening temperature in an oven. It is preferable that the glass preform 20 comprise a material with a low softening temperature, such as SFL6, which is commercially available from Schott Glass of Duryea, Pa.

Figure 6:
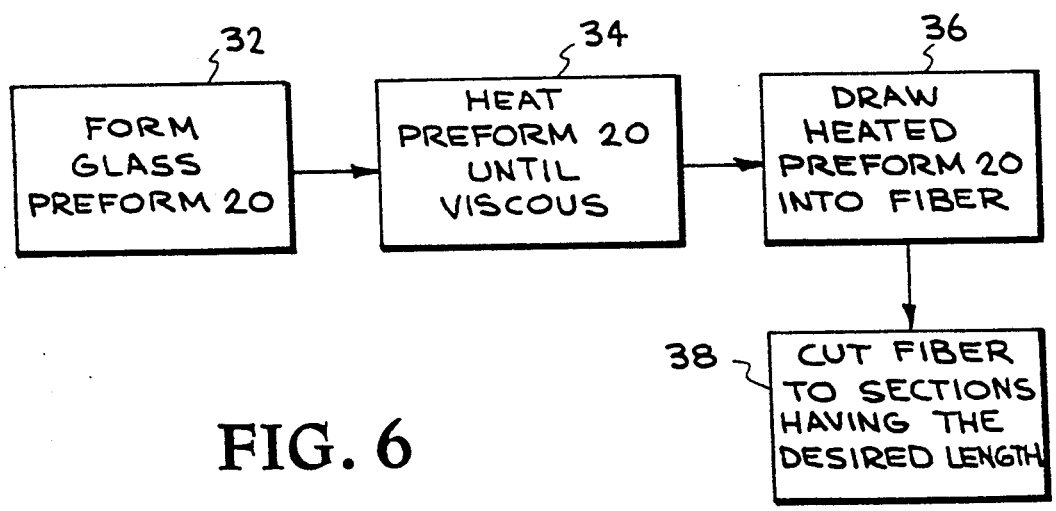
FIG. 6 is flow chart of a preferred method of forming the cylindrical lens of the present invention.

A preferred method for fabricating the cylindrical lens 10 (FIG. 1) is illustrated in the flow chart of FIG. 6. In the first step, illustrated in the box 32, the glass preform 20 is formed into the desired shape. In the next step, illustrated in the box 34, the glass preform 20 is placed in an oven and heated. Preferably, the temperature is carefully controlled so that the temperature is the minimum necessary for drawing; it is believed that a minimum temperature helps the preform 20 to maintain its shape during drawing. In other words, the drawing temperature is preferably chosen so that the glass material of the preform 20 has a viscosity sufficient to permit drawing, but low enough that surface tension does not substantially deform the shape of the preform 20. Surface tension on the heated preform 20 will cause deformation of the shape of the preform 20 and the drawn cylindrical lens, if the viscosity is too low, or if too much time is allowed to pass while the glass remains viscous. Of course, the temperature chosen for any particular application will vary dependent upon the material included in the preform 20; some materials have low softening temperatures, and others have higher softening temperatures. In the next step, illustrated in the box 36, the preform 20 is drawn using analogous optical fiber techniques. As the preform 20 is drawn, a cylindrical microlens fiber is formed having reduced dimensions. For example, the dimensions may be reduced by a factor of fifty to one hundred. The final cross-sectional dimensions (the distance from the first optical surface to the second optical surface) of the drawn microlens fiber may be as small as 50 microns, or possibly as large as 1000 microns (1 millimeter). As it is drawn, the microlens fiber may be spooled onto a cylinder, or it may be cut. In the next step, illustrated in the box 38, the microlens fiber is cut into sections having a desired length which depends upon the application.

The cylindrical lens 10 illustrated in FIG. 1 represents a section of microlens fiber drawn according to the method of the present invention. Such cylindrical lenses 10 have been formed experimentally with cross-sectional dimensions (the distance between the first surface 12 and the second surface 14) of between approximately 185 and 220 microns.

In a preferred embodiment, such as that shown in FIG. 1, the first surface 12 comprises a flat surface, and the second surface 14 comprises a curved surface. More specifically, the second surface 14 may comprise the shape of an ellipse. In that embodiment, it is preferable that a focal line 40 of the ellipse is positioned on, or proximate to the flat surface 12. As a result, a divergent beam 42 emanating from the focal line 40 will exit from the elliptical surface 14, and become a collimated beam 44, as illustrated in the cross-section of FIG. 2. The collimated beam 44 is corrected for spherical aberration. That configuration has application in collimating a beam produced from a small aperture, such as a laser diode. Conversely, a collimated beam 44 entering the cylindrical lens 10 through the elliptical surface 14 will focus along the focal line 40. The lens 10 with the plano-elliptical configuration has application in coupling light into an aperture, such as a detector or a waveguide in integrated optics. Cylindrical lenses 10 having this plano-elliptical configuration have been fabricated with focal lengths of 185 microns and 220 microns. The best results to date have been obtained with the cylindrical lens having the 220 micron focal length.

Figure 10:
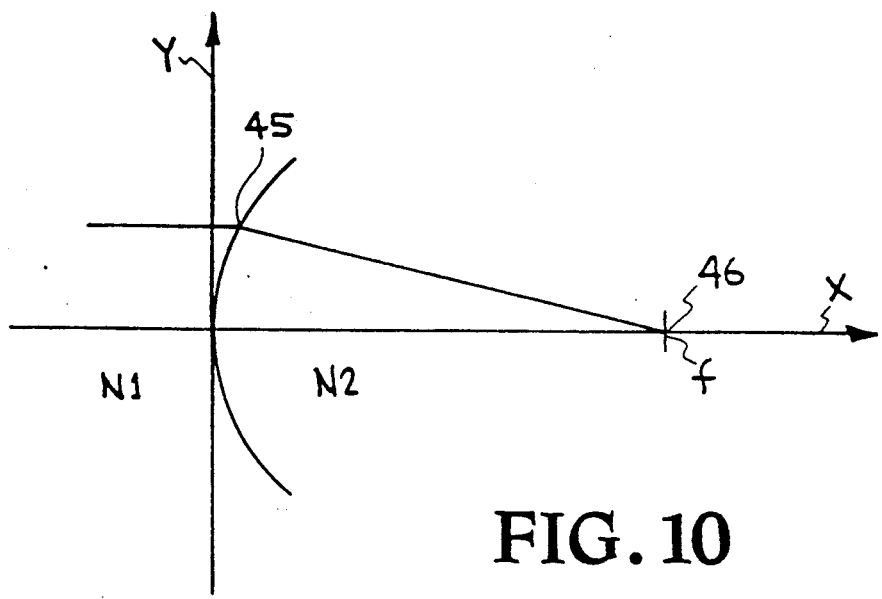
FIG. 10 is a diagram illustrating lens design.

With reference to FIGS. 1 and 10, the cylindrical lens 10 may be designed with a flat first surface 12 and a powered second surface 14 that transforms a plane wave on axis into a perfect cylindrical wave. A "powered" surface is one that acts upon the beam to bend or otherwise shape it. The following are design considerations that may be considered when designing any particular lens. The optical path between the vertex of the dielectric interface 45 and the focus 46 is equated with any other optical path to the focus 46, as shown in FIG. 10:

$$n_2 f = n_1 x + n_2 \sqrt{(f-x)^2 + y^2} \quad (1)$$

where $n_1$ and $n_2$ are the indices of refraction of the media to the left and right of the interface 45, respectively, and f is the focal length from the interface 45 to focus 46. The equation can be rearranged into the standard form for a conic section centered at $x = a$ (8)

$$\frac{(x-a)^2}{a^2} + \frac{y^2}{b^2} = 1 \quad (2)$$

where $$a^2 = \left(\frac{f n_2}{n_2 + n_1}\right)^2 \quad (3)$$

and $$b^2 = f^2 \left(\frac{\pm \Delta n}{n_2 + n_1}\right) \quad (4)$$

are the squares of the semi-major and semi-minor axes, respectively, and $$\Delta n \equiv n_2 - n_1 \quad (5)$$

The eccentricity of the conic section is $$e = \sqrt{1 \pm b^2/a^2} = \frac{n_1}{n_2}, \quad (6)$$

where the lower sign is Eqs. (4) and (6) holds for $n_1 > n_2$.

There are two categories of surfaces free of spherical aberration. If the high index medium is on the right (i.e., $n_1 < n_2$) then the coefficient of the $y^2$ term in Eq. (2) is positive and the curve is an ellipse. Since the focal point is inside the higher index medium, this form has the properties of an immersion lens (9). If the high index medium is on the left then the coefficient of the $y^2$ term in Eq. (2) is negative and the curve is a hyperbola. For both curves, the focal point of the lens coincides with a focus of the conic section, since from Eqs. (3) and (6) the focal length is $$f = a\left(\frac{n_2 + n_1}{n_2}\right) = a + ea \quad (7)$$

The quantity a is the distance along the x axis from the vertex of the conic section to its center, and ea is the distance from the center to the focus.

Since the focal length is proportional to the semi-major axis, and the eccentricity (Eq. (6)) depends only on the indices of refraction, scaling the lens' dimensions uniformly also scales the focal length.

Theoretically, the maximum numerical aperture for a plano-elliptical lens is:

$$M.N.A._{ell} = n^2 \left(\frac{b}{a}\right) = \sqrt{n_2^2 - n_1^2} ,$$

where $n_2$ = the index of refraction in the lens, $n_1$ = the index of refraction in the surrounding media, a = the distance of the semi-major axis of the ellipse, and b = the distance of the semi-minor axis of the ellipse. If the elliptical lens is in air, as is usual, then the maximum numerical aperture is:

$$M.N.A.'_{ell} = \sqrt{n^2 - 1} ,$$

For example, if the elliptical lens is made of SFL6, which has an index of 1.78 at 800 nm, then the maximum possible numerical aperture is 1.47. A higher index lens material would of course provide a higher numerical aperture.

A plano-elliptical cylindrical lens 10 has been fabricated. A 0.75 cm wide preform 20 was generated from a stock SFL6 rod on a numerically controlled universal grinder. The elliptical lens had a focal length of 220 microns, and the index of refraction was 1.78. The semi-major axis a = 141.0 microns, the semi-minor axis b = 117.0 microns, and the eccentricity e = 0.56. The lens thickness was chosen to approximately match the focal length of 220 microns so that the lens could be attached directly to the output facet of a laser diode using index matched optical cement. Full diffraction-limited performance was observed using an interferogram analysis. Diffraction limited performance over a 150 micron aperture (N.A.=0.6) was determined by means of interferometric analysis.

Figure 7:
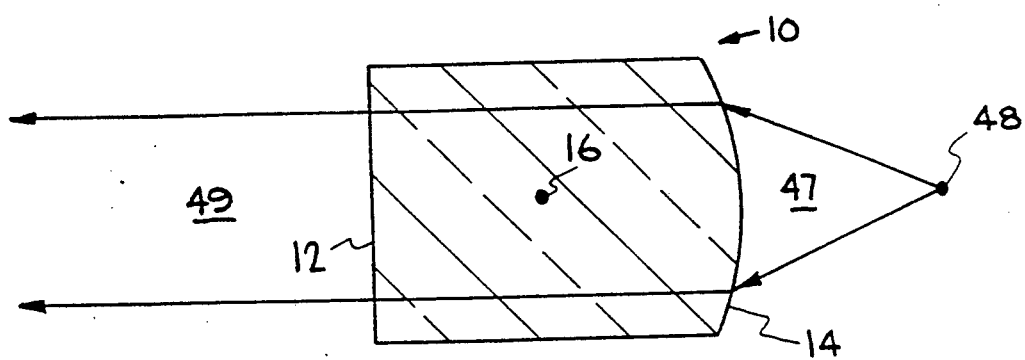
FIG. 7 is a cross-section of a cylindrical lens having a hyperbolic surface.

In another preferred embodiment, the first surface 12 may be flat, and the second surface 14 may comprise the shape of a hyperbola. FIG. 7 illustrates a cross-section of this preferred embodiment, and its effect on light passing through. A light beam 47 propagating from a focus 48 diverges toward the cylindrical lens 10. Entering the second surface 14, the light becomes the collimated beam 49, which exits the flat first surface 12. The collimated beam 49 is corrected for spherical aberration. That configuration may have application as a free-standing lens for collimating a beam from a line source such as a laser diode. Conversely, a collimated beam 49 entering the cylindrical lens 10 through the flat first surface 12 is unaffected until it reaches the hyperbolic second surface 14. Upon its exit from the second surface 14, it focuses to the point 48. That configuration may have application as a free-standing lens for coupling light into an aperture such as a detector or a waveguide in integrated optics. The plano-hyperbolic cylindrical lens has a maximum numerical aperture of:

$$M.N.A._{hyp} = n_2 \left( \frac{b}{ea} \right) = \frac{n_2 \sqrt{n_1^2 - n_2^2}}{n_1},$$

where a=the semi-major axis, b=the semi-minor axis, e=the eccentricity, $n_2$=the index of refraction of the lens, and $n_1$=the index of refraction of the surrounding medium. For the usual case in air, the maximum numerical aperture is:

$$M.N.A.'_{hyp} = \frac{\sqrt{n^2 - 1}}{n},$$

For an SFL6 hyperbolic lens in air, its maximum numerical aperture is 0.83. In comparison, the SFL6 elliptical lens, which has a maximum numerical aperture of 1.47, has a much greater numerical aperture.

Figure 8:
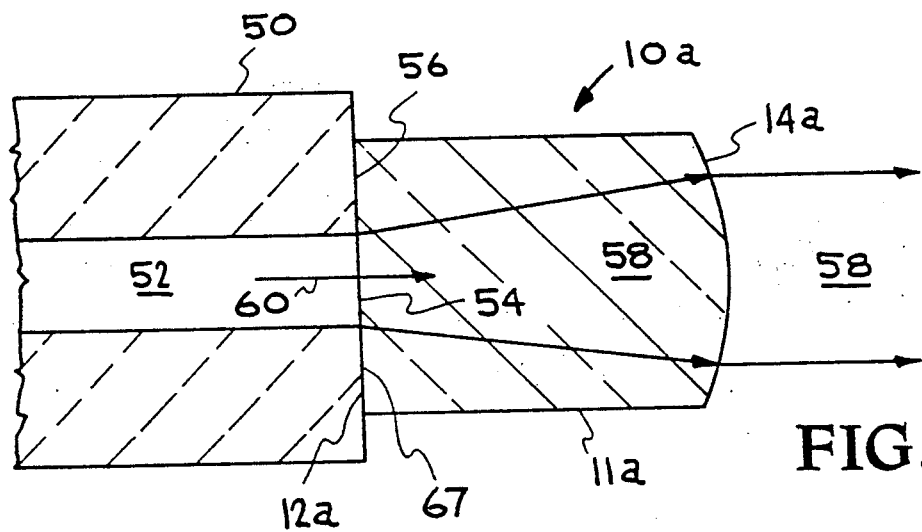
FIG. 8 is a cross-section of a cylindrical lens connected to a laser diode.
Figure 11:
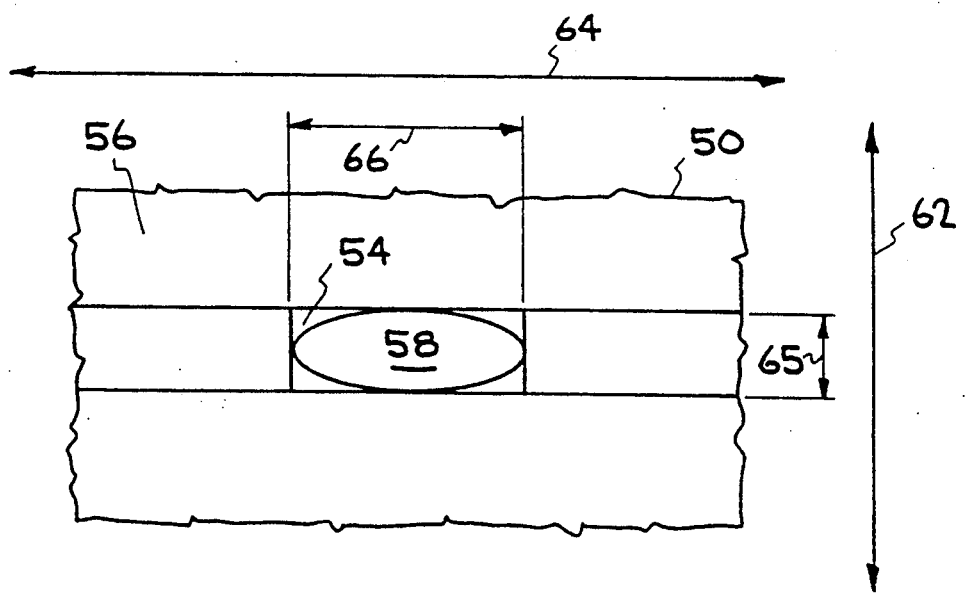
FIG. 11 is a cross-section of a laser beam emitted from the exit aperture of a laser diode.

As illustrated in FIG. 8, if the first surface 12 has a suitable matching shape, the cylindrical lens 10a may be glued to an external surface, such as the output facet of a laser diode. A laser diode 50, shown in cross-section, includes a semiconductor junction 52, which emits laser light from an emitting aperture 54 positioned on a facet 56. The junction 52 provides the gain material for lasing, and defines the laser cavity. A laser beam 58 is emitted from the emitting aperture 54 in the direction of the arrow 60. FIG. 11 is an example of a cross-section of a laser beam 58 at the emitting aperture 54. The narrow portion of the beam 58 defines a fast axis 62, and the wider portion of the beam 58 defines a long axis 64. At the exit aperture 54, the beam 58 has a width 65, for example one micron and a length 66, for example seven microns; however, it is well-known that diffraction effects will cause the beam 58 to diverge much more quickly along the fast axis 62 than along the long axis 66.

The facet 56 is connected to the first surface 12a of the cylindrical lens 10a by any available means, such as gluing. Preferably, an optical cement 67 is used that is index matched to the lens 10. Alternatively, the facet 56 and the first surface 12a may be separated by an index matched material, such as oil, and the diode 50 may be connected to the lens 10a by other mechanical means. With the facet 56 connected to the first surface 12a, an efficient coupling of laser light from the laser diode 50 into the lens 10a is provided.

In most embodiments, it is advantageous that the lens 10 is positioned so that its cylindrical axis 16 (FIG. 1) is parallel to the long axis 64 (FIG. 11) of the laser diode 50. In that configuration, the powered second surface 14 of the lens 10 is positioned to act upon the highly divergent fast axis 62 of the laser beam 58.

In one embodiment, the second surface 14 includes the shape of an ellipse, and the emitting aperture 54 is positioned to be proximate to the focal point of that ellipse. In that embodiment, the laser beam 58 exiting the lens 10a is substantially collimated along the fast axis 62.

In another embodiment, the cylindrical lens 10 comprises a shape to cause the highly diverging fast axis 62 of the beam 58 to become less diverging. For example, the curve of the second surface 14 may be selected to cause the beam 58 to have a divergence along its fast axis 62 that is similar to the divergence of the beam 58 along its long axis 64, thereby providing a beam 58 that is approximately equally diverging along both axes 62, 64.

Figure 9:
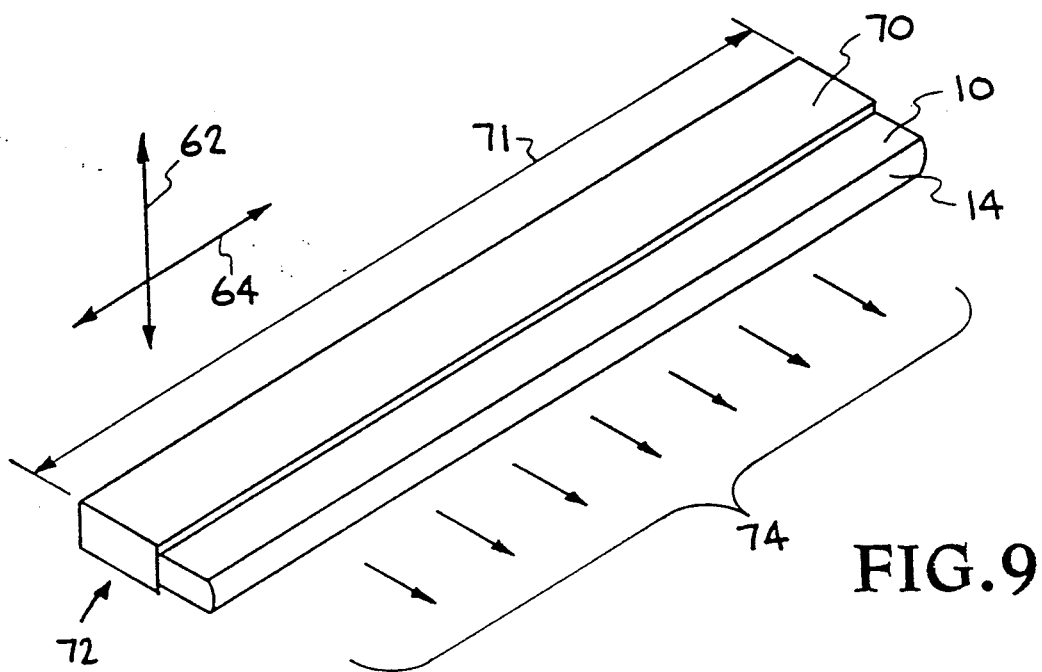
FIG. 9 is a perspective view of a laser diode bar and a cylindrical lens connected to form an assembly.

The cylindrical lens 10 may be connected to any type of laser diode 50 having a suitable shape for connecting the output facet 56 and the first surface 12. FIG. 9 illustrates a laser diode bar 70, which emits laser light a substantial distance along its length 71. The cylindrical lens 10 is connected to the laser diode bar 70 to form an assembly 72. The cylindrical axis 16 (FIG. 1) of the lens 10 is positioned parallel to the long axis 64 of the laser diode bar 70. Although the curved second surface 14 of the lens 14 may have any shape, it is preferable if the surface 14 has a shape selected so that a laser beam 74 emitted from the lens 10 is substantially collimated along its fast axis 62. For example, if the curved second surface 14 is formed so that it has an elliptical shape along the fast axis 62, and the focal point of the ellipse is proximate to the emitting aperture 54 (FIG. 8), then the laser beam 74 emitted from the lens 10 will be substantially collimated along its fast axis 62.

In the embodiments of the cylindrical lens 10 where the second surface has an elliptical shape, as in FIG. 2, it has been mentioned that it is preferable to position the focal point of that ellipse proximate to the first surface 12. The preform 20 may be designed with that configuration, but due to imperfections in manufacturing, the actual focal point of the drawn cylindrical lens 10 may vary with respect to the first surface 12. Therefore, in some applications, it may be preferable to design the focal point adjacent to the optical surface 12, at a position such as at a point 76, illustrated in FIG. 2. Thus, when an actual cylindrical lens 10 is formed, the position of the lens 10 with respect to the emitting aperture 54 may be adjusted to a position that causes the output beam 74 to be substantially collimated along its fast axis 62. In this position, the beam 74 may exit the lens 10 at an angle depending upon the focal curve of the lens 10.

A laser diode bar 70 is an efficient, compact source of laser radiation, and when connected to the lens 10 in the laser diode-lens assembly 72, many applications are possible. For example, an array of the laser diode-lens assemblies 72 may be connected together to form an efficient, high-intensity collimated output. The laser diode-lens assembly 72 provides a package that is well suited for pumping solid state laser material.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

What is claimed is:

1. A laser assembly for providing a beam of laser radiation, comprising:
   a laser diode having a rectangular emitting aperture defining a first axis along its width and a second axis normal to the first axis along its length; and,
   a cylindrical microlens bonded to the output facet of said laser diode, said cylindrical microlens comprising an optical fiber having a cylindrical axis positioned parallel to said second axis, wherein;
   the boundary of the cross section of said microlens perpendicular to said cylindrical axis includes a portion shaped approximately like a curved conic section, wherein;
   said portion has a non-zero eccentricity.

2. The laser assembly as claimed in claim 1, wherein the laser diode comprises a laser diode bar having an emitting aperture that is substantially longer along its second axis than it is wide along its first axis.

3. The laser assembly as claimed in claim 1, wherein the cylindrical microlens has a shape to partially collimate the first axis of laser radiation emitted from the laser diode, so that the divergence of the beam along the first axis is approximately matched to the beam's divergence along the second axis.

4. The laser assembly as claimed in claim 1, wherein the cylindrical microlens has a shape to collimate the first axis of laser radiation emitted from the laser diode.

5. The laser assembly as claimed in claim 1, wherein said conic section shape is elliptical.

6. The laser assembly as claimed in claim 5, wherein said cylindrical microlens has a focal line positioned proximate to the emitting aperture of the laser diode.

7. The laser assembly as claimed in claim 1, wherein said cylindrical microlens comprises a flat surface bonded to the facet of the laser diode.

8. The laser assembly as claimed in claim 7, further comprising an optical material that is index matched to the cylindrical lens, said optical material being positioned in a thin layer between the cylindrical lens and the output facet of the laser diode.

9. The laser assembly as claimed in claim 8, further comprising an optical cement that is index matched to the cylindrical lens, said optical cement bonding the cylindrical lens with the output facet of the laser diode.

10. A laser assembly for providing a beam of laser radiation that is substantially collimated along at least one axis, comprising:
    a laser diode bar having an emitting aperture with a narrow portion defining a fast axis and a substantially longer portion defining a long axis; and,
    a cylindrical microlens bonded to the output facet of said laser diode, said cylindrical microlens comprising an optical fiber having a shape to substantially collimate the fast axis component of the laser beam emitted from said aperture, wherein;
    said shape includes a cross-sectional boundary shaped approximately like a curved conic section, wherein said boundary has a non-zero eccentricity.

11. The laser assembly as claimed in claim 10, wherein said curved conic section is an ellipse.

12. The laser assembly as claimed in claim 11, wherein said cylindrical microlens has a focal line positioned proximate to the output facet of the laser diode.

13. The laser assembly as claimed in claim 10, wherein said cylindrical microlens comprises a flat surface bonded to the output facet of the laser diode.

14. The laser assembly as claimed in claim 13, further comprising an optical material that is index matched to the cylindrical lens, said optical material being positioned between the cylindrical lens and the output facet of the laser diode.

15. The laser assembly as claimed in claim 14, further comprising an optical cement that is index matched to the cylindrical lens, said optical cement bonding the cylindrical lens with the output facet of the laser diode.

16. A cylindrical microlens for collimating the output of a laser diode, said cylindrical microlens comprising an optical fiber having:
    a first optical surface having a shape matched to a facet of a laser diode for bonding thereto; and,
    a second optical surface positioned in an opposed relationship to the first optical surface, said second optical surface having an elliptical shape along the boundary of its cross section, wherein said second surface is positioned between 50 and 1000 microns of the first surface, said ellipse having a focal point positioned outside the lens and adjacent to the first surface.

17. The cylindrical microlens as claimed in claim 16, wherein the first optical surface comprises a flat surface formed parallel to the cylindrical axis of the microlens.

* * * * *